United States Patent [19]
Deegen et al.

[11] 4,087,747
[45] May 2, 1978

[54] ARRANGEMENT FOR TESTING ELECTRIC SAMPLES WITH A PLURALITY OF PROBE CONTACT POINTS

[75] Inventors: Axel W. Deegen; Michael J. Kessler, both of Herrenberg, Germany

[73] Assignee: International Business Machines Corporation, Armonk, N.Y.

[21] Appl. No.: 726,366

[22] Filed: Sep. 24, 1976

[30] Foreign Application Priority Data

Dec. 29, 1975 Germany .............................. 2559004

[51] Int. Cl.² ...................... G01R 31/02; G01R 15/15
[52] U.S. Cl. ............................... 324/72.5; 324/73 PC; 324/73 R; 324/158 P
[58] Field of Search ............... 324/72.5, 73 R, 73 PC, 324/73 AT, 158 P, 158 F; 339/17 CF, 108 TP; 269/8; 279/1 M

[56] References Cited

U.S. PATENT DOCUMENTS

| 2,918,648 | 12/1959 | Ludman et al. | 324/73 PC X |
| 3,280,715 | 10/1966 | Corl et al. | 269/8 X |
| 3,543,679 | 12/1970 | Wahl | 269/8 X |
| 3,723,867 | 3/1973 | Canarutto | 324/73 PC |
| 3,842,346 | 10/1974 | Bobbitt | 324/73 R |
| 3,848,188 | 11/1974 | Ardezzone et al. | 324/73 AT |

OTHER PUBLICATIONS

Circuit Board Test Fixture F. W. Beckman Western Electric Technical Digest No. 43 July 1976.

Primary Examiner—Rudolph V. Rolinec
Assistant Examiner—Vincent J. Sunderdick
Attorney, Agent, or Firm—G. R. Gugger

[57] ABSTRACT

An arrangement for testing electric samples, such as, circuit components, circuit assemblies, and circuit cards having a plurality of probe contact points. An electromagnetic holding plate is provided on which several testing heads of the same and/or different probe contact point configuration are releasably mounted. The individual testing heads are arranged on the holding plate in accordance with the respective configuration of the sample. Each of the testing heads contains a number of testing tips which are adapted to the configuration of the probe contact points of their associated parts of the sample. The testing heads are connected to a suitable control unit which provides supply voltage and test pulses.

3 Claims, 3 Drawing Figures

ARRANGEMENT FOR TESTING ELECTRIC SAMPLES WITH A PLURALITY OF PROBE CONTACT POINTS

BACKGROUND OF THE INVENTION

A prior arrangement for testing electric samples is described in GE-OS 23 60 801. In this arrangement, a plate is provided which serves as a carrier for a plurality of testing tips which are fixed in the carrier and are spaced from each other in a predetermined distance. For testing a sample, this testing head can be brought into agreement with the respective probe contact points of the sample. So as to ensure a relatively flexible applicability of such a testing arrangement, this plate with the testing pins can be made larger than the samples, but only under the condition that the distance pattern of the testing tips corresponds to the distance pattern of the probe contact points on the sample. It is furthermore necessary that upon testing the position coordinates of the sample on the contacting tips are determined and that subsequently the control applies the necessary testing voltages to the individual contacting points. Via a computer the testing program, which is in general determined for each sample, is carried out. In order to determine the correct position of the probe contact points, a decoding matrix is provided by means of which the contact points and the testing tips are addressed. If the surface of the plate with the testing tips provided therein, is quite large, the application is relatively flexible as long as the contact pattern between the testing head and sample is in agreement. When these conditions are altered, which is the case in present day practical application in view of the increasing tendency towards continuously rising packing density of the integrated circuit elements and assemblies, the entire plate with its contacting tips is no longer usable. A testing head arrangement adapted to a different spacing has to be prepared. This obviously involves considerable effort.

Another way of selecting the testing pins contacting the probe contact points is described in the IBM Technical Disclosure Bulletin Vol. 17, No. 2, July, 1974, pages 459 and 460. According thereto, the testing head consists of two parts where in the upper part pins are resiliently supported and in the lower part the testing pins are arranged in the same distance and pattern as in the upper part. Between the upper and the lower part, a mask is inserted having holes which correspond to the distance and pattern of the probe contact points to be contacted. When the two parts are joined together, with the mask being included, only those testing pins touch the contacts which are actuated by the pins that protrude through apertures in the mask. This arrangement is suitable particularly for use in testing printed circuit cards. If the pattern of the card as a whole is changed, for instance through a change, if only partly, of the distances of the probe contact points, which then no longer correspond to the distances of the testing pins and the operating pins, the entire testing unit or the entire testing head, respectively, is no longer usable.

SUMMARY OF THE INVENTION

The present invention provides a device for samples that have a plurality of probe contact points and the configuration and mutual distance of which can be altered partly or completely. The device is adaptable as simply and flexibly as possible to these altered circumstances.

In accordance with the invention, a holding plate is provided which can be lifted and lowered and on which several testing heads of the same and/or different probe contact point configuration are releasably mounted. In the preferred embodiment, the holding plate is an electromagnetic plate and on the side facing the holding plate the individual testing heads are provided with a magnetic supporting plate by means of which they adhere to the electromagnetic plate. For safeguarding the adherence in case of current switch-off or failure, the electromagnetic holding plate is made of a material with a high remanence and is provided with meander or snakelike slots extending parallel to each other and having the current conductors provided therein. The current of two such adjacent slotted areas is guided in opposite directions so that a chessboard-like distribution of magnetic north and south poles extends over the magnetic plate. It is thus ensured that in all possible configurations, the testing heads will securely adhere to the magnetic plate.

Another advantage of the present arrangement is that the individual testing heads are arranged on the holding plate in accordance with the respective configuration of the sample and the pattern of the testing tips of the individual different testing heads is adapted to the biggest continuously repeated pattern of the probe contact points of the individual parts of the sample. Electrical connections are provided via the testing tips applied on the probe contacts with the connections being addressed and evaluated by a suitable control device and, if necessary, by a computer.

For the correct positioning of the individual testing heads on the holding plate, the individual testing heads are advantageously placed and adjusted on the sample points corresponding thereto and then the holding plate is lowered onto this arrangement of the testing heads on the individual sample parts. With the holding plate in the lowered position, the individual testing heads are fixed in this position by means of switching on the current so that the individual magnetic poles of the holding plate now irremovably grip the testing heads. With the testing heads thus fixed to the holding plate, the respective product samples can successively be tested with full contacting.

The present novel and improved testing arrangement permits an advantageous and very flexible adaptation to changes of the sample. When, for instance, in one part of the sample to which a single testing head is associated there is an alteration with another testing head arrangement, only this particular testing head has to be newly made. All others can remain as they are. It is also possible, for instance on a large circuit card containing several individual modules of a plurality of assembled electric circuits which differ from each other, to arrange those modules in a different configuration on the circuit card and to carry out the testing process without there being any necessity of changing one single testing head. Only its arrangement relative to the position of the sample has to be readjusted. Therefore, samples, such as, large and wide circuit cards with upper and lower sides and with interposed conductive planes having their probe contact points led to the upper or lower side, can be tested. Furthermore, components and component assemblies applied on such circuit cards can be tested, in their individual as well as in their logic function, with all other components assembled on the circuit card. Consequently, the essential advantage of the present invention is that a full contacting of a complete sample is possible and that all logic variations can realistically be tested at the same time. This is possible with the present arrangement whose flexibility is greatly increased and which easily and simply considers production changes.

It is, then, a primary object of the present invention to provide a novel and improved arrangement for testing electric samples, such as, circuit components, circuit assemblies, and circuit cards having a plurality of probe contact points.

A further object of the present invention is to provide a novel and improved device for testing samples that have a plurality of probe contact points the configuration and distance of which can be altered partly or completely with said device being adaptable as simply and flexibly as possible to these altered circumstances.

A still further object of the present invention is to provide a novel and improved device for testing electric samples and wherein a holding plate that can be lifted and lowered is provided on which several testing heads of the same and/or different probe contact point configurations are releasably mounted and the individual testing heads are arranged on the holding plate in accordance with the respective configuration of the sample.

Another object of the present invention is to provide a novel and improved device for testing electric samples and wherein the pattern of testing tips of individual different testing heads is adapted to the biggest continuously repeated pattern of probe contact points of individual parts of the sample.

A further object of the present invention is to provide a novel and improved testing arrangement wherein a full contacting of probe contact points on a complete sample is possible and all logic variations can realistically be tested at the same time.

The foregoing and other objects, features and advantages of the invention will be apparent from the following more particular description of a preferred embodiment of the invention as illustrated in the accompanying drawings.

DESCRIPTION OF PREFERRED EMBODIMENT

Figure 1:
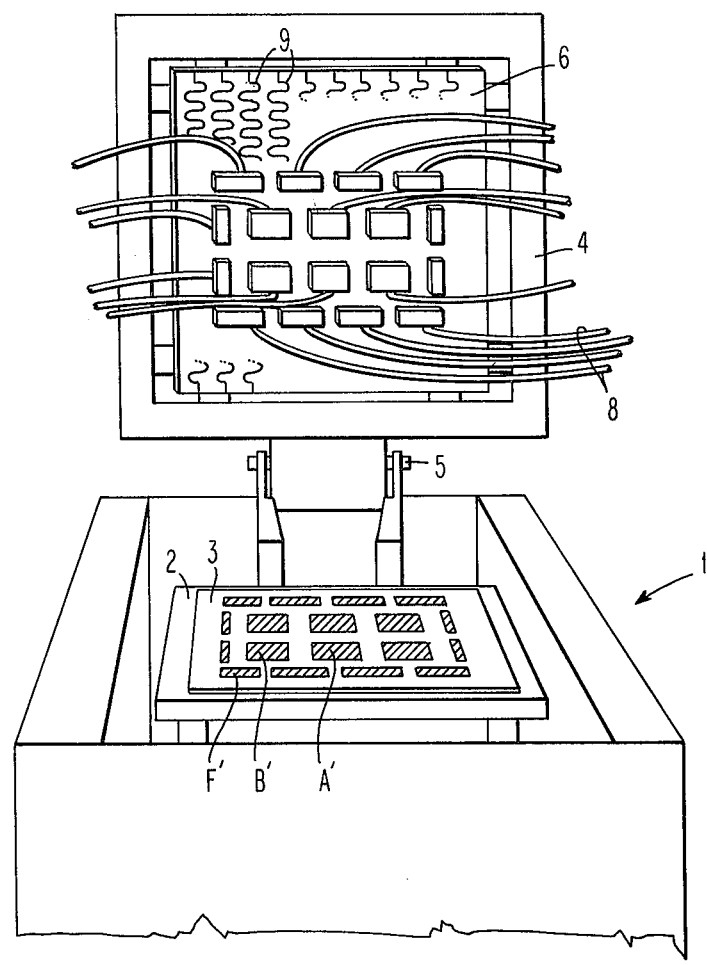
FIG. 1 is a schematic general view of the testing device where the holding plate is shown in opened position and shows a plurality of individual testing heads and where, at the same time, a sample is placed on the bed of the testing device.

Referring to FIG. 1, there is shown a testing arrangement 1 embodying the principles of the present invention. Onto a support 2 which can be lifted and lowered by a hydraulic device, not shown, a sample 3 is placed. This sample can be a circuit card on which, for example, six modules of high packing density are provided. Surrounding these six modules a total of, for example, another twelve electronic component groups of the same or different design can be provided on the border. Such an arrangement, applied on a circuit card, represents for computer technology an already highly integrated component containing a great amount of elements which is generally installed in computer frames. The number of probe contact points provided on such a sample 3 can, for instance, be approximately 18000. These are divided into more than 1000 probe contact points per module A' and B' and into several hundred for the other electronic components C', D', E', and F'. This, of course, can vary according to type of use and pattern.

Figure 3:
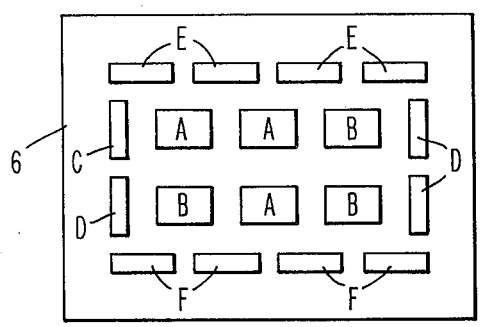
FIG. 3 shows schematically a testing configuration.

Test arrangement 1 contains a pivoting frame 4 which can be turned around an axis 5 and lifted or lowered, respectively, and mounted on the frame is a holding plate 6 which is designed as an electromagnetic plate. In the present embodiment, the individual testing heads A to F are magnetically fixed to the holding plate and are arranged as shown in FIG. 3. Connected to each of the testing heads is a bundle of electric lines 8 which connect to a control unit and connected computer, which are not shown. A process control computer System IBM/7 can, for instance, be used as the computer or another and larger system, if necessary. Each of the testing heads A to F contain a number of testing tips which are adapted to the configuration of the probe contact points of their associated parts of sample A' to F'. Via these testing tips and the connections to the lines 8 arranged in the testing heads, the sample is contacted and fed at its contacts with supply voltage and test pulses. A great variety of tests can thus be performed. For testing, a hydraulic drive, for example, may be used to turn the pivoting arm 4 with magnetic plate 6 and the sample 3 may be brought into testing position by means of a hydraulic press which lifts the bed 2. Thus, all probe contact points are contacted simultaneously and a complete testing of all possible connections can thus be realized.

The individual configuration of one single testing head such as testing head A, for example, can differ from that of testing head B. Furthermore, the arrangement of this configuration can differ with respect to the arrangement of sample parts A' or B', respectively, of the sample 3. As an example, in the upper row, three respective sample parts of type A' can be provided, and in the lower row three sample parts of type B', or they may be alternated. In the arrangement of testing heads A and B, this can easily be considered in that they are correspondingly displaced and newly adjusted. This demonstrates the considerable advantage that for such a re-design of the sample only a readjustment is necessary and not a newly made testing head.

Figure 2:
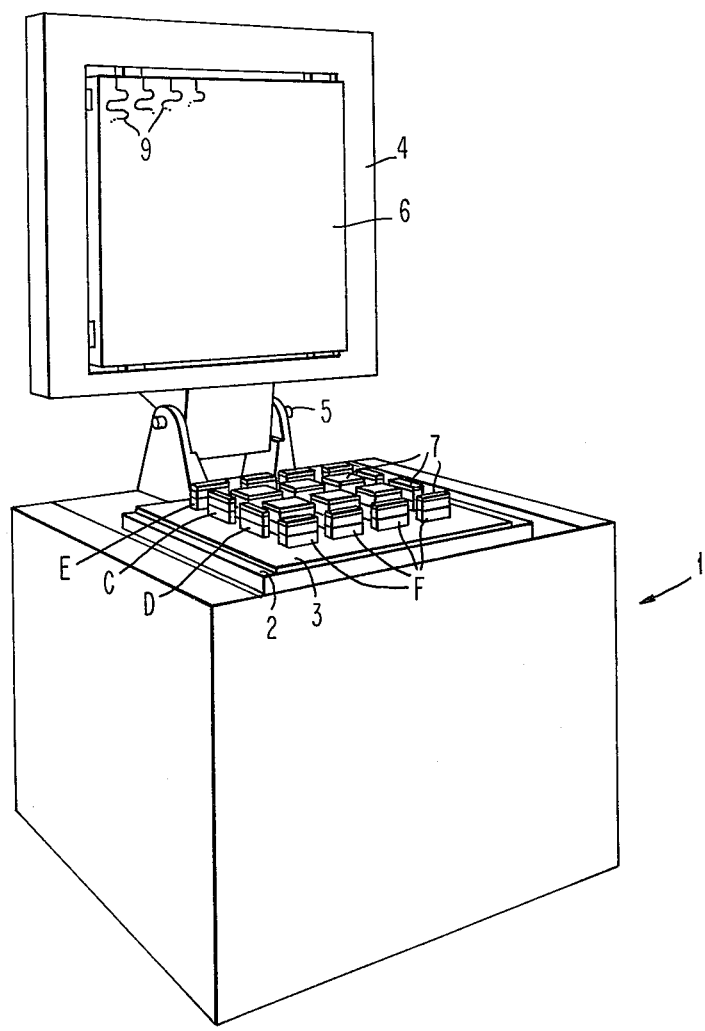
FIG. 2 is a similar representation to the one in FIG. 1, except the holding plate does not carry the individual testing heads, i.e. they are placed on the sample.

FIG. 2 shows an arrangement similar to that of FIG. 1. In FIG. 2, the pivoting arm 4 with its holding plate 6 is fully lifted and does not carry any testing heads A to F. Instead, these testing heads A to F are all arranged on sample 3 which rests on its support 2. The individual testing heads A to F have on their side associated to holding plate 6 a magnetizable plate 7. By means of these magnetizable plates, they adhere to the electromagnetic plate 6.

As shown in FIG. 2, a magnetic plate is used which is equipped with meander or snake-like slots 9 which are arranged in parallel in stripes one beside the other and which are distributed over the entire plate. Conductors are provided in the slots 9 and current is guided in such a manner that it flows in opposite direction in two snake lines placed directly one beside the other. Thus, a chessboard-like pattern of north and south poles is generated over the entire magnetizable plate 6. It is thus ensured that the individual testing heads A to F can adhere to magnetic plate 6 with their back supporting plates 7 in any position. So as to ensure that upon a voltage drop or a voltage switch-off the testing heads firmly adhere to magnetic plate 6, a high remanence material is used for magnetic plate 6.

The arrangement as disclosed by the invention advantageously permits a highly variable adaptation of the testing head arrangement to a great variety of configurations of the sample. When for instance only the probe contact point configuration of one single part B' of the sample is changed, only the corresponding testing head B need be changed in its configuration of probe contact points. All other individual testing heads remain unchanged. Furthermore, even with the same probe contact point configuration of the individual sample parts, but with another arrangement on the sample this can be considered simply by correspondingly displacing the respective testing head. A very flexible and universally applicable variable contact head is thus provided.

While the invention has been particularly shown and described with reference to a preferred embodiment thereof, it will be understood by those skilled in the art that various changes in form and details may be made therein without departing from the spirit and scope of the invention.

What is claimed is:

1. In an arrangement for testing electric samples, such as, circuit components, circuit assemblies, and circuit cards which have a plurality of probe contact points, the combination of:
    a plurality of testing heads provided with testing tips in a large number and predetermined pattern which are adapted to be applied to said probe contact points;
    control means electrically connected to said testing heads and tips;
    a liftable and lowerable electromagnetic holding plate; and
    a magnetizable support plate associated with each testing head for releasably mounting said testing heads onto said holding plate, said heads being arranged on the holding plate in accordance with the respective configuration of the sample to be tested and providing a flexible and universally applicable variable contact head.

2. A process for testing electric samples, such as, circuit components, circuit assemblies, and circuit cards which have a plurality of probe contact points, which comprises;
    applying onto a sample a plurality of testing heads each having a magnetizable support plate and a pattern of testing tips which correspond to a related pattern of probe contact points on said sample;
    lowering an electromagnetic holding plate onto the support plates of said testing heads in their applied testing position; and
    fixing said testing heads in their testing position by applying current to said electromagnetic holding plate and providing a flexible and universally applicable variable contact head.

3. In an arrangement for testing electric samples, such as, circuit components, circuit assemblies, and circuit cards which have a plurality of probe contact points, the combination of:
    a plurality of testing heads provided with testing tips in a large number and predetermined pattern which are adapted to be applied to said probe contact points;
    control means electrically connected to said testing heads and tips;
    a liftable and lowerable electromagnetic holding plate;
    a magnetizable support plate associated with each testing head for releasably mounting said testing heads onto said holding plate, said heads being arranged on the holding plate in accordance with the respective configuration of the sample to be tested; and
    a plurality of snake-like slots in said electromagnetic holding plate which are arranged parallel to each other and which contain conductors whereby current flows through two adjacent conductors in opposite directions so that the entire holding plate is covered with a chessboard-like pattern of alternating north and south poles.

* * * * *